(12) United States Patent
Standaert et al.

(10) Patent No.: US 11,937,514 B2
(45) Date of Patent: Mar. 19, 2024

(54) HIGH-DENSITY MEMORY DEVICES USING OXIDE GAP FILL

(71) Applicant: International Business Machines Corporation, Armonk, NY (US)

(72) Inventors: Theodorus E. Standaert, Clifton Park, NY (US); Daniel Charles Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 337 days.

(21) Appl. No.: 17/313,403

(22) Filed: May 6, 2021

(65) Prior Publication Data
US 2022/0359814 A1 Nov. 10, 2022

(51) Int. Cl.
*H10N 50/01* (2023.01)
*H10B 61/00* (2023.01)
(Continued)

(52) U.S. Cl.
CPC ............. *H10N 50/80* (2023.02); *H10B 61/00* (2023.02); *H10N 50/01* (2023.02); *H10N 50/10* (2023.02);
(Continued)

(58) Field of Classification Search
CPC .. H10N 70/011; H10N 70/841; H10N 70/231; H10N 50/10; H10N 50/01; H10N 50/80; H10B 63/00; H10B 61/00
See application file for complete search history.

(56) References Cited

U.S. PATENT DOCUMENTS 6,952,030 B2    10/2005    Herner
8,866,242 B2    10/2014    Li
(Continued)

FOREIGN PATENT DOCUMENTS

CN    103426809 A    12/2013
TW    202113993 A    4/2021

OTHER PUBLICATIONS

"Patent Cooperation Treaty PCT Notification of Transmittal of the International Search Report and the Written Opinion of the International Searching Authority, or the Declaration", Applicant's file reference PF220311PCT, International application No. PCT/CN2022/089031, International filing date Apr. 25, 2022 (Apr. 25, 2022), dated Jun. 28, 2022 (Jun. 28, 2022), 10 pages.

(Continued)

*Primary Examiner* — Ali Naraghi
*Assistant Examiner* — Siangluai Mang
(74) *Attorney, Agent, or Firm* — Edward J. Wixted, III

(57) ABSTRACT

A semiconductor structure forms two or more tightly pitched memory devices using a dielectric material for a gap fill material. The approach includes providing two adjacent bottom electrodes in a layer of an insulating material and above a metal layer. Two adjacent pillars are each above one of the two adjacent bottom electrodes where each pillar of the two adjacent pillars is composed of a stack of materials for a memory device. A spacer is around the vertical sides each of the two adjacent pillars. The dielectric material is on the spacer around the vertical sides each of the two adjacent pillars, on the layer of the insulating material between the two adjacent bottom electrodes. The dielectric material fills at least a first portion of a gap between the two adjacent pillars. A low k material covers the dielectric material and exposed portions of the layer of the insulating material.

23 Claims, 9 Drawing Sheets

(51) Int. Cl.
*H10N 50/10* (2023.01)
*H10N 50/80* (2023.01)
*H10B 63/00* (2023.01)
*H10N 70/00* (2023.01)
*H10N 70/20* (2023.01)

(52) U.S. Cl.
CPC ............ *H10B 63/00* (2023.02); *H10N 70/011* (2023.02); *H10N 70/231* (2023.02); *H10N 70/841* (2023.02)

(56) References Cited

U.S. PATENT DOCUMENTS

| | | |
|---|---|---|
| 9,343,659 B1 | 5/2016 | Lu |
| 9,614,143 B2 | 4/2017 | Lu |
| 10,573,808 B1 * | 2/2020 | Saraf .................... H10N 70/063 |
| 10,692,925 B2 | 6/2020 | Rizzolo |
| 11,133,178 B2 | 9/2021 | Balseanu |
| 11,495,532 B2 * | 11/2022 | Lin ........................ H10B 63/80 |
| 2009/0032963 A1 * | 2/2009 | Tran ................... H01L 21/76816 257/774 |
| 2009/0081862 A1 | 3/2009 | Chen |
| 2010/0301449 A1 | 12/2010 | Scheuerlein |
| 2013/0119494 A1 | 5/2013 | Li |
| 2014/0015143 A1 * | 1/2014 | Liu .................... H10N 70/8418 257/E21.241 |
| 2016/0365505 A1 | 12/2016 | Lu |
| 2019/0074219 A1 | 3/2019 | Zhang |
| 2019/0385898 A1 | 12/2019 | Peng |
| 2020/0066599 A1 | 2/2020 | Zhang |
| 2020/0075398 A1 | 3/2020 | Shin |
| 2020/0176468 A1 | 6/2020 | Herner |
| 2021/0091302 A1 | 3/2021 | Reznicek |
| 2021/0375988 A1 * | 12/2021 | Ko ........................ G11C 11/161 |
| 2021/0384424 A1 * | 12/2021 | Hsiao ..................... H10B 63/80 |
| 2022/0102629 A1 * | 3/2022 | Kuo ..................... H10N 70/801 |
| 2022/0165936 A1 * | 5/2022 | Shen ..................... H10N 50/85 |
| 2022/0209109 A1 * | 6/2022 | Loy ..................... H10N 70/021 |

OTHER PUBLICATIONS

Disclosed Anonymously, et al., "Method and Structure for Back-End-Of-Line (BEOL) Fat Wire Level Ground Rule Compatible Embedded Memory Integration", IPCOM000259732D, ip.com Prior Art Database Technical Disclosure, Sep. 11, 2019, pp. 1-6.

* cited by examiner

HIGH-DENSITY MEMORY DEVICES USING OXIDE GAP FILL

BACKGROUND OF THE INVENTION

The present invention relates generally to the field of semiconductor device manufacture and more particularly to the formation of high-density memory device structures.

Increasing computing function requiring both more device circuits and faster processing speeds continues for computer systems and applications. In particular, the use of deep neural networks is becoming pervasive in many end-use computer applications. Deep neural networks are typically used in artificial intelligence (AI) applications. The training of deep neural networks puts significant demand on the memory system in computer systems executing AI with deep neural networks.

Increasing demand for high performance memory systems continues to drive the development of new and advanced memory devices in memory chips. Developments in advanced memory devices include magnetoresistive random-access memory (MRAM) which is a type of non-volatile random-access memory that stores data in magnetic domains, resistive random-access memory (RRAM or ReRAM) that works by changing the resistance across a dielectric solid-state material, and phase change random-access memory (PCRAM or PCM) that uses phase change materials which typically have at least two solid phases, a crystalline state and an amorphous state, with very different electrical properties.

The demand for high performance memory systems in current computer applications drives an increasing density of memory devices in memory chips. Decreasing the pitch, or space between memory devices, both increases the number of available memory devices in a memory chip and reduces the distance between memory devices thereby, increasing memory chip performance.

SUMMARY

Embodiments of the present invention disclose a semiconductor structure that includes two adjacent bottom electrodes in a layer of a first dielectric material and above a metal layer. The semiconductor structure includes two adjacent pillars that are each above one of the two adjacent bottom electrodes where each pillar of the two adjacent pillars is composed of a stack of materials for a memory device. Additionally, the semiconductor structure includes a spacer around vertical sides each of the two adjacent pillars. The semiconductor structure includes a second dielectric material on the spacer around vertical sides each of the two adjacent pillars, on the layer of first dielectric material between the two adjacent bottom electrodes where the second dielectric material fills at least a first portion of a gap between the two adjacent pillars. The semiconductor structure includes a low k material covering the oxide material and exposed portions of the layer of the first dielectric material.

Embodiments of the present invention disclose a semiconductor structure that includes two adjacent bottom electrodes in a layer of a first dielectric material and above a metal layer. The semiconductor structure includes two adjacent pillars that are each above one of the two adjacent bottom electrodes where each pillar of the two adjacent pillars is composed of a stack of materials for a memory device. Additionally, the semiconductor structure includes two spacers, where each spacer is around one of the two adjacent pillars. The semiconductor structure includes a second dielectric material covering each of the two spacers and filling a first portion of a gap between the two adjacent pillars. The semiconductor structure includes a void in the second dielectric material that is adjacent to one or more of the bottom portion of the stack of materials or the two bottom electrodes. The semiconductor structure further includes two top electrodes over the two adjacent pillars and a low k dielectric material on the oxide material, surrounding the two top electrodes, and on exposed portions of the layer of the first dielectric material adjacent to the second dielectric material.

Embodiments of the present invention disclose a semiconductor structure including two adjacent bottom electrodes in a layer of a first dielectric material and above a metal layer. The semiconductor structure with two adjacent pillars are each on one of the two adjacent bottom electrodes, where each pillar of the two adjacent pillars is composed of a stack of materials for a memory device. The semiconductor structure includes a layer of a spacer material around the vertical sides each of the two adjacent pillars and a thinner portion of the layer of the spacer material on surfaces of the first dielectric material. The semiconductor structure includes a second dielectric material on the spacer around the vertical sides of each of the two adjacent pillars, on the thinner portion of the spacer material on the surfaces of the first dielectric material, and filling at least at least a first portion of a gap between the two adjacent pillars. Additionally, the semiconductor structure includes a low k material covering the second dielectric material and exposed portions of the thinner portion of the layer of the spacer material on surfaces of the first dielectric material and a top electrode on top of each of the two adjacent pillars in the low k dielectric material.

Embodiments of the present invention provide a method of forming tightly pitched memory devices using a second dielectric material for a gap fill between the vertical structures of the tightly pitched semiconductor devices. The method includes forming at least two vertical memory structures on at least two adjacent bottom electrodes in a first dielectric layer, where each vertical memory structure of the at least two vertical memory structures is a pillar for a magnetoresistive random-access memory device. The method includes forming a spacer on each vertical memory structure and depositing a second dielectric material over the at least two vertical memory structures and the first dielectric layer. The method includes performing an etch of the second dielectric material, where the etch leaves the second dielectric material on the vertical sides of the spacer on each vertical memory structure and on the first dielectric layer between the at least two bottom electrodes. The method includes depositing a low k dielectric material over the second dielectric material and on exposed portions of the first dielectric layer and forming a top electrode on each pillar for the magnetoresistive random-access memory device.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
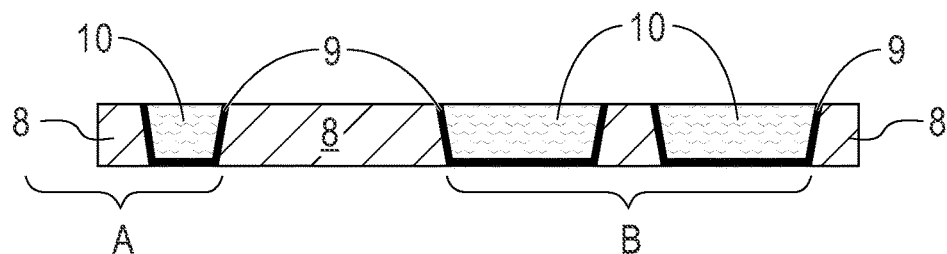
FIG. 1 depicts a cross-sectional view of a semiconductor structure with a personalized metal layer in an interlevel dielectric (ILD) in accordance with an embodiment of the present invention.

Embodiments of the present invention recognize that computer applications for artificial intelligence are requiring memory systems with increased function. Embodiments of the present invention recognize that the increased functionality of memory systems continues to drive more advanced semiconductor devices including a number of advanced memory device structures.

Embodiments of the present invention recognize that providing increased functionality of memory systems drives not only the development of advanced memory device structures but continues to drive increased memory device density. Embodiments of the present invention recognize that the focus on increasing computer application performance, particularly for deep neural networks, requires more advanced memory devices and tighter pitches between the memory devices to provide higher functionality memory systems.

Embodiments of the present invention recognize that developing densely packed advanced memory devices with advanced 14 nm and future 7 nm semiconductor device technology, creates increasing semiconductor process challenges. The semiconductor process and material challenges are especially pronounced when the advanced memory devices forming tightly pitched arrays. Embodiments of the present invention recognize that an ability to fill the recesses created between the vertical structures in tightly pitched advanced memory devices is becoming increasingly difficult.

Embodiments of the present invention recognize that as the vertical structures, such as magnetic tunnel junction (MTJ) pillars also known as MRAM pillars, in advanced non-volatile memory devices become very dense, and closely packed, an incomplete fill of the recess or gap between vertical structures can occur. The incomplete fill of the gap between tightly pitched memory devices creates seams or voids between the vertical structures of the memory devices that can capture processing chemicals or cause shorting between the top electrodes. Additionally, the seam or void created between the vertical structures or pillars in advanced memory devices reduces the breakdown strength of the dielectric material used to fill the gap between the vertical structures in the memory device. Embodiments of the present invention recognize that new materials and processes that provide an ability to fill the gap or recesses between tightly pitched vertical structures of advanced memory device are desirable.

Embodiments of the present invention provide semiconductor structures and methods of forming densely packed memory devices with effective gap fill between the vertical structures of the tightly pitched advanced memory devices. Embodiments of the present invention provide several methods and materials for creating tightly pitched advanced memory devices with an essentially void-free dielectric fill between vertical structures in an array of advanced memory devices. While embodiments of the present invention disclose several methods for forming tightly pitched MRAM devices with essentially void-free gap fill between the MRAM pillars, embodiments of the present invention also provide the methods and materials apply to other advanced memory devices, such as RRAM and PCRAM devices.

Embodiments of the present invention provide a semiconductor structure for advanced memory devices using a dielectric material, such as an oxide material or a spin-on-glass to fill the gap between the vertical structures in the advanced memory device, such as the gap between adjacent MRAM pillars. Embodiments of the present invention use dielectric materials, such as various oxide materials between the tightly pitched MRAM pillars for better conformality or gap fill than the low k materials typically deposited between MRAM pillars.

Embodiments of the present invention provide a semiconductor structure where the dielectric material fills the gap between the MRAM pillars to prevent void or seam formation between top electrodes or bitlines in the closely pitched MRAM devices. Additionally, embodiments of the present invention include deposition a low k dielectric between the top electrodes and bitlines in the memory region and in the logic region of the semiconductor chip for improved electric performance. The low k dielectric material in the logic region of the semiconductor structure and between top electrodes and bitlines in the memory region of the semiconductor chip provides better switching speeds and reduce parasitic capacitance than a similar thickness of a deposited oxide material or other dielectric material with a higher dielectric constant.

Using a dielectric material, such as an oxide material with improved gap fill to fill the recesses between the tightly pitched vertical structures or pillars of the memory devices reduces the aspect ratio or the depth of the low k dielectric fill between the top electrodes and bitlines. Embodiments of the present invention using dielectric materials with better gap fill than currently used low k dielectric material provide an essentially void-free gap fill between the pillars of the MRAM devices.

Embodiments of the present invention include materials and processes providing a dielectric material deposition that fills the space between the vertical structures, such as MRAM pillars of the MRAM devices, and provides an essentially void-free semiconductor structure in the top electrode area of the memory devices in a memory region of a semiconductor chip. Furthermore, using the materials and processes of the present invention, if a small void is formed in the gap or recess between the vertical structures or MRAM pillars, the void is formed in the lower portion of the gap that is away from the top electrode or bitlines. Embodiments of the present invention include providing the materials and the deposition process that can pinch off the gap between MRAM pillars. In embodiments of the present invention, during dielectric material deposition, the pinched off portion of the gap occurs in a top portion of the gap between adjacent MRAM pillars. In this way, if a small void is created in the semiconductor structure between the MRAM pillars, the void will not short out the top electrodes.

Embodiments of the present invention provide an embedded memory device with a reduced fill height for the low k dielectric material between the MRAM pillars. By depositing the oxide material with better gap fill prior to depositing the low k material, less low k material is needed to fill the gap between the MRAM pillars. The dielectric material fills most or all of the gap between the memory device vertical structures thereby reducing the aspect ratio of the gap fill for the low k dielectric material (e.g., reduces the height of the gap filled by the low k dielectric). The aspect ratio of the gap fill for the for the low k dielectric material is the fill height of the low k dielectric material divided by the height of the MRAM pillars measured from a top surface of the dielectric material around the bottom electrodes to the bottom of the top electrodes.

Embodiments of the present invention provide a method of forming tightly pitched advanced memory devices without a void in the top electrode area of the adjacent advanced memory devices. The method is discussed with reference to tightly pitched MRAM devices however, the method can be applied to other advanced memory devices, such as RRAM devices, PCRAM devices, etc. The method includes depositing a dielectric layer as a cap over exposed portions of an ILD layer with embedded portions of a bottom metal layer in the ILD. The dielectric cap layer and the bottom metal layer are above a semiconductor substrate and may be above one or more semiconductor devices. The metal layer can be the M0 layer, the M1 layer, or a layer in a middle of the line (MOL) of the semiconductor structure or in a back-end-of-the line (BEOL) semiconductor structure. Embodiments of the present invention form at least two adjacent tightly pitched MRAM devices by forming the bottom electrodes of the MRAM devices. Forming the bottom electrodes includes patterning the dielectric cap layer and etching the dielectric cap layer to expose a portion of the bottom metal layer. A metal liner material may be deposited in the recesses in the dielectric cap layer and on the exposed metal layer. Using deposition processes, such as plasma vapor deposition or chemical vapor deposition, a layer of electrode material is deposited over the metal liner in the recesses. A chemical mechanical polish removes excess electrode material from the top surface of the dielectric cap layer to form two or more tightly pitched bottom electrodes on the bottom metal layer (e.g., M1).

The method includes depositing a stack of material layers to form a magnetic tunneling junction (MTJ) for the MRAM device with a layer of a hardmask material. The stack of material layers for the MTJ is covered by the hardmask. The stack of material layers for the MTJ are deposited over the dielectric cap layer with the bottom electrodes.

Using known MRAM pillar formation processes, an etch removes portion of the stack of materials layers for the MTJ, the hardmask, and a top portion of the dielectric cap layer. After the etch, for example, using photolithography and a reactive ion etch, the remaining vertical portions of the stack of material layers and the hardmask form the MRAM pillars on the bottom electrode. A top portion of the metal liner surrounding the bottom electrodes is exposed while a bottom portion of the metal liner surrounding the bottom portion of the bottom electrodes are surrounded by the remaining portion of the dielectric cap layer.

After depositing a layer of spacer material over the remaining exposed portions of the hardmask, the stack of material layers, the top portion of the metal liner around the bottom electrodes, and the top surface of the dielectric cap layer, and using a self-aligned process (e.g., a reactive ion etch), a spacer is formed around each of the MRAM pillars on the bottom electrodes. For embodiments of the present invention, the MRAM pillars are composed of the stack of material layers with the hardmask.

In some embodiments of the present invention, a partial spacer is formed using the self-aligned spacer formation processes. The partial spacer can be a spacer where the anisotropic etch or reactive ion etch does not completely remove the spacer material from the horizontal surfaces of the semiconductor structure. In these embodiments, a thin portion of spacer material remains on the exposed horizontal surfaces of the dielectric cap layer and the hardmask material.

Embodiments of the present invention provide several methods of depositing a second dielectric material over the semiconductor structure. The second dielectric material can be a silicon oxide, a spin-on-oxide, a nitride, or another insulating material, such as a spin-on-glass may be deposited. The deposition may occur by but, not limited to plasma-enhanced chemical vapor deposition (PECVD), physical vapor deposition (PVD), atomic layer deposition, a spin-on-process, or using a flowable oxide material. Using these methods of dielectric material deposition can provide a void-free deposition or in some cases, almost void-free deposition of the second dielectric material between the MRAM pillars. If a small void is formed between the tightly pitched adjacent MRAM pillars in the second dielectric material using any of these deposition methods, the small void will be in a lower portion of the MRAM pillar or below the lower portion of the hardmask in the MRAM pillar. The method further includes removing the portions of the second dielectric material over the dielectric cap layer that are not between the adjacent, tightly pitched MRAM pillars. Using a dielectric removal process tailored to the deposition process, the removal process or etch process removes the second dielectric material that is not between the adjacent MRAM pillars while leaving most of the second dielectric material between the MRAM pillars. For dielectric materials deposited by PECVD, PVD, CVD, atomic layer deposition (ALD), or spin-on-processes, using a self-aligned process, such as a reactive ion etch (RIE) as an anisotropic etch process, the second dielectric material can be removed (e.g., the second dielectric material above the exposed horizontal surface of the dielectric cap layer) can be removed. Only a top portion of the dielectric material between the tightly pitched MRAM pillars is removed. Due to lack of space or small space between the MRAM pillars, the anisotropic etch does not remove most of the dielectric material between the MRAM pillars. After the anisotropic etch, a large portion of the second dielectric material remains between the MRAM pillars. The second dielectric material can remain between portions of the hardmask material in the MRAM pillars.

Embodiments of the present invention provide a method of depositing a low k dielectric material over the semiconductor structure. Using conventional electrode formation processes, an etch of the low k dielectric material over the hardmask in the MRAM pillars and in select areas of the logic region of the semiconductor structure occurs. A metal liner is deposited over the exposed hardmask and inside the recess created by the etch of the low k dielectric. A conductive metal layer is deposited in the recess over the hardmask and in the recesses formed in the logic region to form one or more top electrodes on the hardmask in the MRAM pillars and lines or contacts in the logic region, respectively.

Embodiments of the present structure provide a low k dielectric material filling the area between the top portion of adjacent, tightly pitched MRAM pillars and covering the connections or devices in the logic region. Using tightly pitched, adjacent MRAM pillars formed using one of the methods and materials as described in embodiments of the present invention prevents void formation between the top electrodes or in the vicinity of the top electrodes and bitlines of tightly pitched advanced memory devices (e.g., MRAM, RRAM, or PCRAM devices). Depositing a dielectric material, such as an oxide material with improved conformal deposition, improves the gap fill between vertical structures in tightly pitched memory devices.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context dictates otherwise. Thus, for example, reference to "a component surface" includes reference to one or more of such surfaces unless the context dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" or "contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication, and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Reference will now be made in detail to the embodiments of the present invention, examples of which are illustrated in the accompanying drawings, wherein like reference numerals refer to like elements throughout.

FIG. 1 depicts a cross-sectional view of semiconductor structure 100 with Mx 10 in ILD 8 in accordance with an embodiment of the present invention. As depicted, FIG. 1 includes Mx 10 with metal liner 9, ILD 8, logic region A, and memory region B. Logic region A is a portion of semiconductor structure 100 that includes where one or more logic devices can be formed or are present. Memory region B includes a portion of semiconductor structure 100 that includes one or more memory devices or where one or more memory devices may be formed.

Mx 10 is a portion of a metal layer in semiconductor structure 100. Mx 10 can be a portion of a metal layer formed in a front-end of the line (FEOL), a middle-of-the line (MOL), or BEOL process of semiconductor manufacture. For example, Mx 10 can be a bottom metal layer that is in the M1 metal layer. In another example, Mx 10 is in the M0 metal layer. While three portions of Mx 10 are depicted in FIG. 1, embodiments of the present invention are not limited to this number of Mx 10. Mx 10 can be above a portion of a semiconductor device (not depicted) or above a semiconductor substrate (not depicted). In some examples, one or more of Mx 10 metal connects to the underlying semiconductor device (not depicted). The underlying semiconductor device may be a metal-oxide-semiconductor field-effect transistor (MOSFET) device, or CMOS device based on various architectures such as a planar-FET, FinFET, horizontal Gate-All-Around (h-GAA) FET, or vertical Gate-All-Around (v-GAA) FET but is not limited to these semiconductor devices. In some embodiments, Mx 10 is used to form a bottom electrode (e.g., bottom electrodes 30 which may be surrounded, in part, by dielectric layer 20). Mx 10 may be composed of any known metal materials, such as, but not limited to, tungsten (W), copper (Cu), cobalt (Co), or ruthenium (Ru) used in metal layers of semiconductor chips.

As depicted in FIG. 1, Mx 10 is surrounded by metal liner 9. Metal liner 9 can be composed of a pure metal material, a metal nitride material, or a combination of layers of one or more of these materials. For example, metal liner 9 may be composed of one or more of metal materials, such as tantalum (Ta), titanium (Ti), W, Co, or Ru, or metal nitride materials, such as titanium-nitrogen alloys, tantalum-nitrogen alloys, titanium-aluminum-nitrogen alloys, or tantalum-aluminum-nitrogen alloys. Metal liner 9 is not limited to these materials. In an embodiment, metal liner 9 is not present.

ILD 8 may be composed of any known dielectric material used as an ILD material in semiconductor chip manufacture. For example, ILD 8 is composed of $SiO_2$. As depicted, ILD 8 surrounds and separates each of Mx 10 with metal liner 9.

Figure 2:
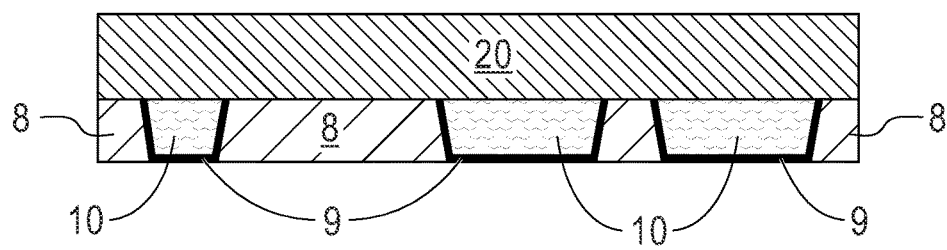
FIG. 2 depicts a cross-sectional view of the semiconductor structure after depositing a dielectric layer in accordance with an embodiment of the present invention.

FIG. 2 depicts a cross-sectional view of semiconductor structure 200 after depositing dielectric layer 20 in accordance with an embodiment of the present invention. As depicted, FIG. 2 includes ILD 8, metal liner 9, Mx 10, and dielectric layer 20. Dielectric layer 20 can be any insulating material, such as silicon nitride (SiN), silicon carbide (SiC), or SiCN but is not limited to, these dielectric materials. Using known dielectric material deposition processes, such as but, not limited to, chemical vapor deposition (CVD), or plasm vapor deposition process (PVD), dielectric layer 20 can be deposited over the top surfaces of Mx 10, metal liner 9, and ILD 8 as a cap dielectric layer. The thickness of dielectric layer 20 can range from 20 to 500 nm but is not limited to these thicknesses. For example, a typical thickness of dielectric layer 20 can be 55 nm.

Figure 3:
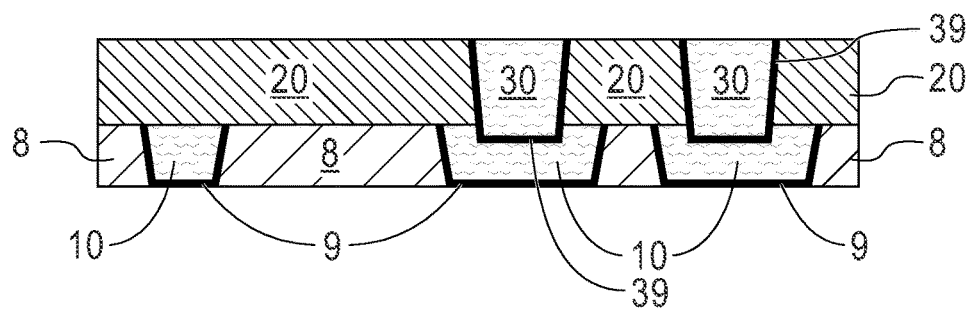
FIG. 3 depicts a cross-sectional view of the semiconductor structure after forming a bottom electrode with a metal liner in accordance with an embodiment of the present invention.

FIG. 3 depicts a cross-sectional view of semiconductor structure 300 after forming bottom electrodes 30 with metal liner 39 in accordance with an embodiment of the present invention. As depicted, FIG. 3 includes ILD 8, metal liner 9, Mx 10, dielectric layer 20, metal liner 39, and bottom electrodes 30. FIG. 3 includes two adjacent bottom electrodes 30, in other embodiments, two or more adjacent bottom electrodes 30 may be present. For example, bottom electrodes 30 can be two adjacent bottom electrodes 30 in a four-by-four matrix of bottom electrodes. In one embodiment, one or both of metal liners 9 and 39 are not present.

Bottom electrodes 30 can be formed using known semiconductor processes and materials for electrode formation in memory devices. For example, the top surface of dielectric layer 20 can be patterned using known photolithography processes, and an etch of dielectric layer 20 exposes a top portion of Mx 10, for example using a dry or wet etching process. A metal liner material, such as but, not limited to, Ta, Ti, W, Ru, or a metal nitride alloy can be deposited on exposed portions of Mx 10 and dielectric layer 20 for metal liner 39. An electrode material, such as but, not limited to TaN, TiN, tungsten, or a combination of these materials can be deposited over metal liner 39. A chemical-mechanical polish (CMP) can occur using dielectric layer 20 as a CMP stop to remove excess electrode materials and metal liner material from the top surface of dielectric layer 20. Metal liner 39 and bottom electrodes 30 remain in the recesses formed during the etch of dielectric layer 20. The electrode material for bottom electrodes 30 may include but, is not limited to, copper (Cu), titanium nitride (TiN), Ti, tungsten (W), tungsten nitride (WN), tungsten carbide (WC), tantalum (Ta), TaN, silver (Ag), gold (Au), aluminum (Al), or the like. After bottom electrodes 30 formation, a typical space between two adjacent bottom electrodes 30 with metal liner 39 can be 7 to 800 nm but, is not limited to these spacings.

Figure 4:
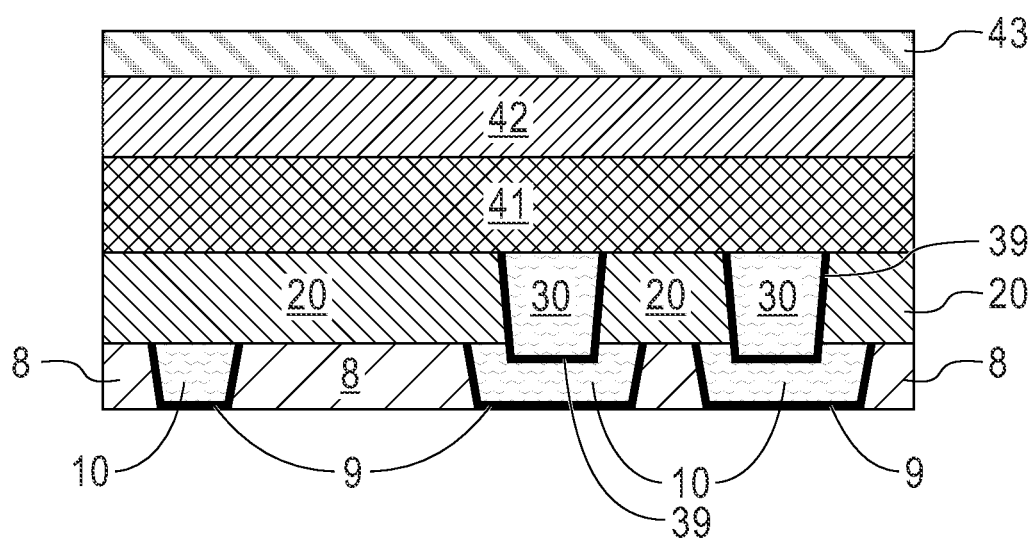
FIG. 4 depicts a cross-sectional view of the semiconductor structure after depositing a stack of material layers for a magnetic tunnel junction (MTJ) and a hardmask layer in accordance with an embodiment of the present invention.

FIG. 4 depicts a cross-sectional view of semiconductor structure 400 after depositing a stack of material layers 41, hardmask (HM) 42, and sacrificial material 43 in accordance with an embodiment of the present invention. Stack of material layers 41 can create a magnetic tunnel junction (MTJ) in an MRAM device. While FIG. 4 discusses stack of material layers 41 forming an MTJ in an MRAM pillar, in other embodiments, stack of material layers 41 are a stack of material layers 41 for a RRAM, a PCRAM, a DRAM, or another type of memory device. For example, stack of material layers 41 for a RRAM can include a $HfO_2$ layer with a Ti buffer layer or $Ta_2O_5$ layer with a $TaO_x$ layer, where x is an integer. In another example, stack of material layers 41 for a PCRAM could include multiple layers of one or more phase change materials, heater element materials, such as TiN, and/or electrode materials.

Depositing sacrificial material 43 on HM 42 that is on stack of material layers 41, where stack of material layers 41 is over the exposed portions of dielectric layer 20, bottom electrodes 30, and metal liner 39, provides materials for later MRAM pillar formation. For example, as known to one skilled in the art, examples of typical materials in a stack of materials for a MRAM pillar (e.g., for stack of material layers 41) includes more than one multilayered ferromagnetic film separated by thin spacers (e.g., tantalum, aluminum oxide, etc.). Stack of material layers 41 and HM 42 can form the MRAM pillars, as depicted in FIG. 6, using the processes discussed later with respect to FIGS. 5 and 6. In an embodiment, a pedestal (not depicted in FIG. 4) is deposited on top of dielectric layer 20 and under stack of material layers 41. For example, the pedestal can be a layer of a metal, a metal nitride (e.g., TaN), or a combination of these materials (e.g., a combination of W, Ta, Ti, N, etc.).

HM 42 can be any hardmask material used semiconductor devices. For example, HM 42 may be a metal (e.g., Al, W, Ta, Ti), a metal nitride (e.g., WN, TaN, TiN), or a combination of these materials. In various embodiments, sacrificial material 43 is deposited over stack of material layers 41. For example, sacrificial material 43 can be silicon dioxide or amorphous carbon. In an embodiment, sacrificial material 43 is not present.

Figure 5:
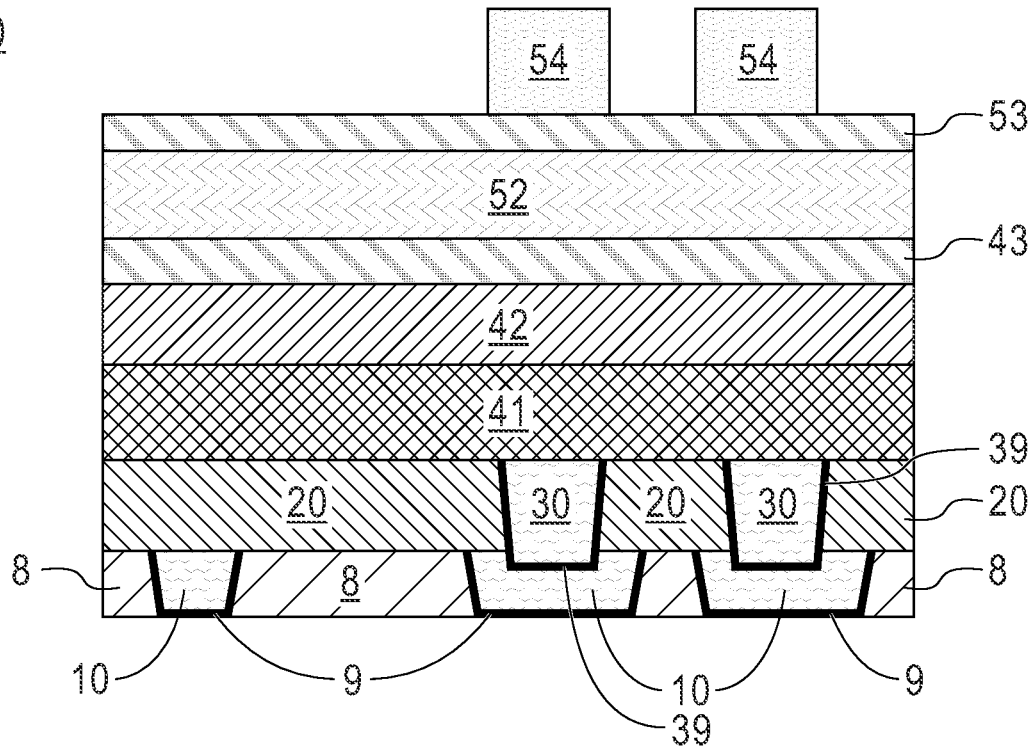
FIG. 5 depicts a cross-sectional view of the semiconductor structure after depositing an optical planarization layer (OPL) covered by an anti-reflection (AR) coating with a personalized resist in accordance with an embodiment of the present invention.
Figure 6:
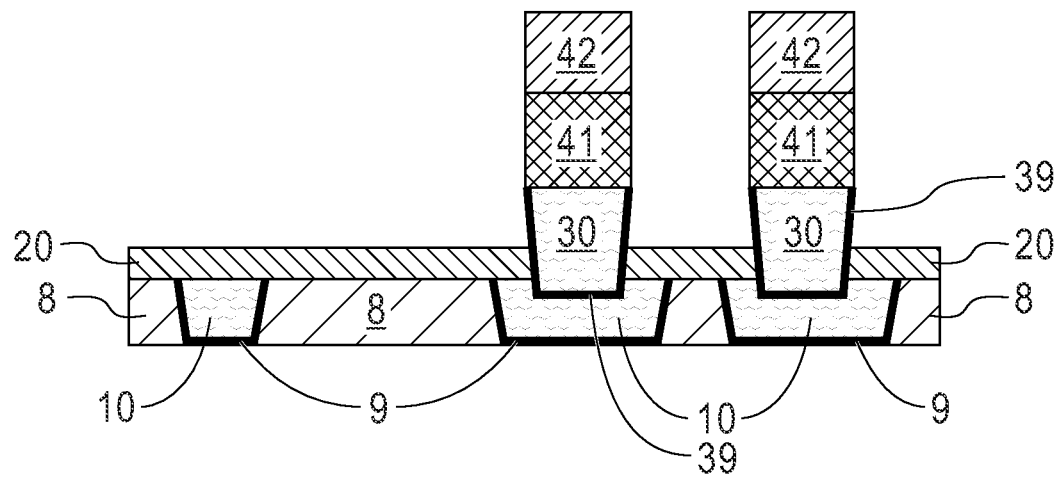
FIG. 6 depicts a cross-sectional view of the semiconductor structure after a etch process in accordance with an embodiment of the present invention.

FIG. 5 depicts a cross-sectional view of semiconductor structure 500 after depositing OPL 52 covered by AR coating 53, and patterned resist 54 in accordance with an embodiment of the present invention. As depicted, FIG. 5 includes ILD 8, metal liner 9, Mx 10, dielectric layer 20, bottom electrodes 30, metal liner 39, stack of material layers 41, HM 42, sacrificial material 43, OPL 52, AR coating 53, and resist 54 after patterning (e.g., after using photolithography to pattern resist 54). Two portions of resist 54 reside on AR coating 53 above bottom electrodes 30.

OPL 52 can be spin-on-carbon or any one of commercially available OPL materials. OPL 52 may be applied over the top surface of sacrificial material 43 (when present) or over HM 42 (when sacrificial material 43 is not present) using a known spin-on-process.

In various embodiments, AR coating 53 is over OPL 52. AR coating 53 can be a single layer or composed of a number of layers of materials commonly used in semiconductor manufacture to reduce image distortions associated with reflections off the surface of the substrate or OPL 52 during photolithography. For example, AR coating 53 can be a spin-on-oxide material but is not limited to this material or deposition method.

Resist 54 is depicted after personalization or patterning. Two portions of resist 54 reside on AR coating 53 above each of the two bottom electrodes 30. The two portions of resist 54 can be used for patterning memory pillar or MRAM pillar patterning. For example, the two portions of resist 54 determine the portions of stack of material layers 41 remaining in FIG. 6 after the etch process forms two MRAM pillars.

FIG. 6 depicts a cross-sectional view of semiconductor structure 600 after an etch of stack of material layers 41 and HM 42 in accordance with an embodiment of the present invention. Using known MRAM pillar formation processes, the etch of stack of material layers 41 and HM 42 creates two MRAM pillars on bottom electrodes 30. As depicted, FIG. 6 includes ILD 8, metal liner 9, Mx 10, a bottom portion of dielectric layer 20, bottom electrodes 30, metal liner 39, stack of material layers 41, and HM 42. Using patterned resist 54 and an etch process, for example, a reactive ion etch (RIE), an ion beam etch (IBE), or a combination of these processes, the exposed portions of AR coating 53, OPL 52, sacrificial material 43, HM 42, a top portion of dielectric layer 20, and stack of material layers 41 can be removed. After the etch, two remaining portions of stack of material layers 41 with HM 42 remain above each of bottom electrodes 30 and along with the remaining portions of sacrificial material 43, OPL 52, AR coating 53, and resist 54. A typical space between the two remaining portions of stack of material layers 41 after RIE can range from 7 to 800 nm but is not limited these spacings.

One or more additional etch processes can be used to remove the remaining portions of sacrificial material 43, OPL 52, AR coating 53, and resist 54. For example, using a wet etch process with appropriate chemicals removes the remaining portions of sacrificial material 43, OPL 52, AR coating 53, and resist 54. In the some cases, a wet etch removes resist 54 and a second, anisotropic etch (e.g., RIE), removed the remaining portions of AR coating 53, OPL 52, and sacrificial material 43 using the top surface of HM 42 as an etch stop. In various embodiments, a top portion of dielectric layer 20 is removed during etching. The remaining bottom portion of dielectric layer 20 can range in thickness from 5 to 200 nm but, is not limited to these thicknesses. For example, the remaining bottom portion of dielectric layer 20 may be between 20 nm to 50 nm. The remaining portions of stack of material layers 41 on bottom electrodes 30 and HM 42 create two pillars, such as two MRAM pillars.

Figure 7:
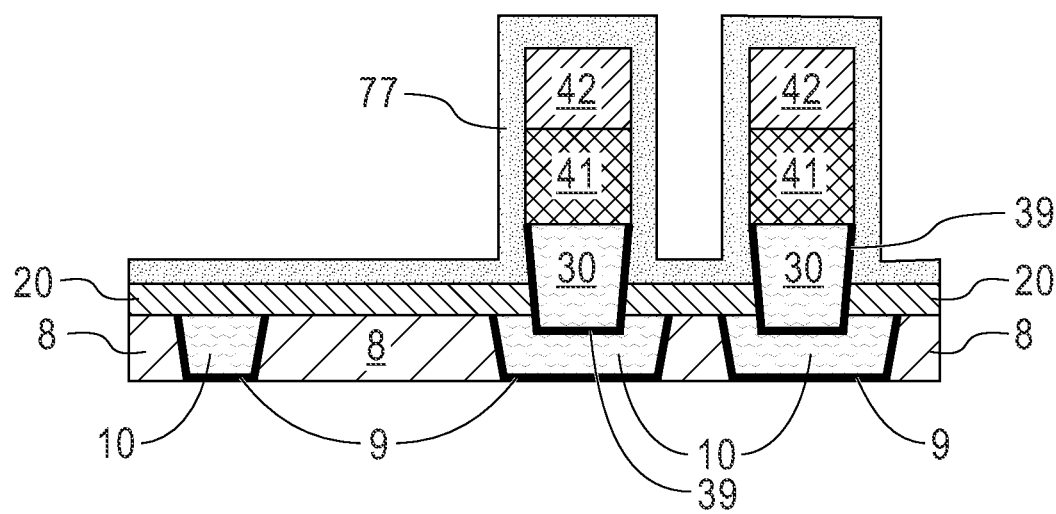
FIG. 7 depicts a cross-sectional view of the semiconductor structure after depositing a dielectric spacer material in accordance with an embodiment of the present invention.

FIG. 7 depicts a cross-sectional view of semiconductor structure 700 after depositing spacer material 77 in accordance with an embodiment of the present invention. As depicted, FIG. 7 includes the elements of FIG. 6 and spacer material 77. Using a spacer material deposition process, such as CVD, PVD, electron beam PVD, plasma-enhanced CVD (PECVD), or ALD, a thin layer of spacer material 77 can be deposited over semiconductor structure 700. Spacer material 77 can include SiN, SiC, and SiC(H), but is not limited to these spacer materials. Spacer material 77 can be deposited over semiconductor structure 700 on exposed surfaces of dielectric layer 20, around exposed surfaces of metal liner 39, on the sides of stack of material layers 41, and on the sides and top surface of HM 42.

Figure 8:
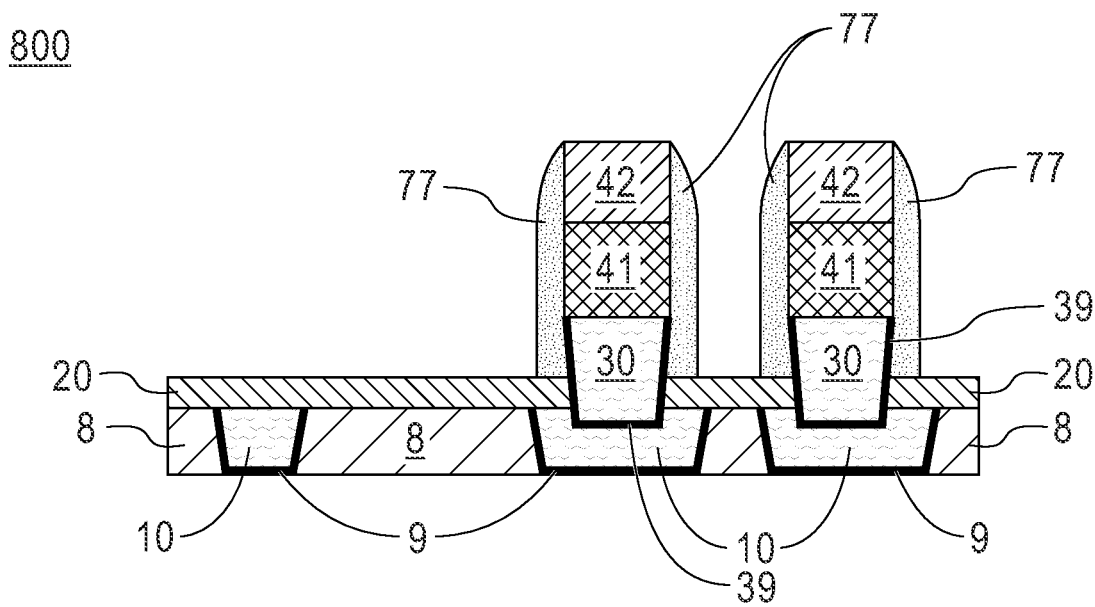
FIG. 8 depicts a cross-sectional view of the semiconductor structure after forming a spacer in accordance with an embodiment.

FIG. 8 depicts a cross-sectional view of semiconductor structure 800 after forming a spacer from spacer material 77 in accordance with an embodiment. Using self-aligned spacer formation processes, an etch of spacer material 77 can form a spacer. In various embodiments, an anisotropic etch, for example using RIE, removes spacer material 77 from horizontal surfaces of dielectric layer 20 and HM 42 to form a spacer around a top portion of metal liner 39, around the side of stack of material layers 41, and the side of HM 42. Hereinafter, in FIGS. 9-12, spacer material 77 will be called spacer 77. Spacer 77 covers the two MRAM pillars.

In another embodiment (not depicted in FIG. 8), a top portion of the spacer is partially removed from horizontal surfaces over dielectric layer 20 and HM 42. The alternative embodiment is discussed in detail later with respect to FIGS. 14-19.

Figure 9:
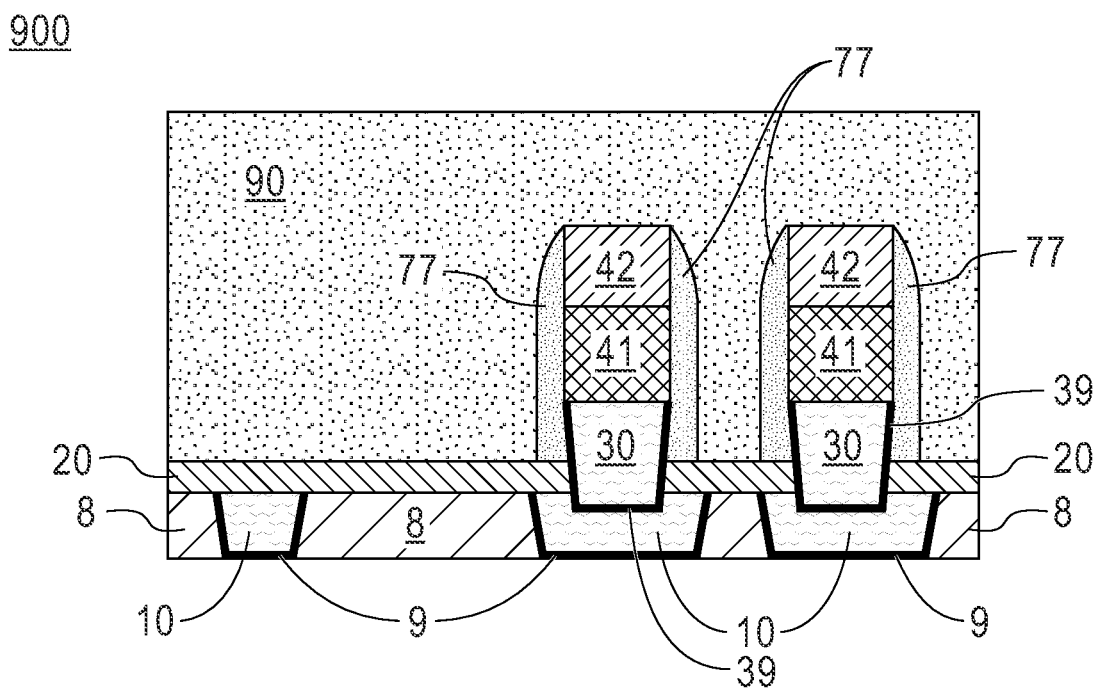
FIG. 9 depicts a cross-sectional view of the semiconductor structure after depositing a layer of an oxide material in accordance with an embodiment of the present invention.

FIG. 9 depicts a cross-sectional view of semiconductor structure 900 after depositing a layer of oxide 90 in accordance with an embodiment of the present invention. As depicted, FIG. 9 includes the elements of FIG. 8 and oxide 90. Oxide 90 can be deposited over exposed surfaces of dielectric layer 20, spacer 77, and HM 42. Oxide 90 can be composed of an oxide material, such as a silicon oxide (e.g., $SiO_2$ or $SiO_x$) material produced from silane ($SiH_4$) or tetraethyl orthosilicate, also known as tetraethoxysilane (TEOS) as precursors for forming an oxide, a PECVD "flowable" oxide-like material, such as SiCOH, flowable SiCOH, SOD, oxynitride (SiON) or a nitride (SiN), or a spin-on-glass for oxide 90, but in not limited to these dielectric materials. Oxide 90 provides good gap fill between the two pillars formed from the top portion of bottom electrodes 30, spacer 77, and HM 42. As known to one skilled in the art, the materials listed above, such as TEOS, flowable SiCOH, SOD, etc. provide better conformality or gap fill than the low k dielectric materials typically used in MRAM device semiconductor device manufacture.

In various embodiments, oxide 90 is deposited by one of PECVD, PVD, CVD, or spin-on methods. The deposition of oxide 90 using one of PECVD, PVD, CVD, or spin-on methods covers dielectric layer 20, spacer 77, and HM 42. As depicted, the layer of oxide 90 extends above the top surface of HM 42.

In some embodiments, depositing oxide 90 over semiconductor structure 900 pinches off the region between the two MRAM pillars that are covered by spacer 77. When the deposition processes pinches off the top portion of the gap between the MRAM pillars, voids cannot form in the area adjacent to HM 42 and especially, not in the area adjacent to the top portion of HM 42. In some cases, when discussing gap fill between the two MRAM pillars and $H_1$ later with respect to FIGS. 10 and 12, the two MRAM pillars may be considered to include the top portion of bottom electrodes 30 above dielectric layer 20.

When forming tight pitch MRAM devices, in particular in tightly pitched memory arrays, the small space or recess between the two MRAM pillars can be filled using oxide 90 that has better gap fill capability than the low k dielectrics typically used for gap fill between adjacent MRAM pillars in MRAM manufacture. As depicted, oxide 90 with improved conformality than current low k dielectric materials provide a void-free fill in the gap between the two MRAM pillars (e.g., oxide 90 fills the gap or area between spacers 77 on the two MRAM pillars).

In some embodiments, oxide 90 is deposited as a flowable dielectric material. Using a flowable CVD (FCVD) deposition or SOD, oxide 90 can deposit over dielectric layer 20, spacer 77, and HM 77. For example, a using silicon dioxide as a flowable dielectric material, oxide 90 covers the top surface of semiconductor structure 900. In various embodiments, after depositing using a flowable process, the top surface of oxide 90 is above the top surface of HM 42 and completely fills the recess between the two MRAM pillars. After deposition, the flowable oxide material can be cured or annealed using known processes, such as ultraviolet (UV) curing at elevated temperatures. In one embodiment, depositing oxide 90 as a flowable dielectric material provides a layer of oxide 90 that covers the sides of stack of material layers 41 and a portion of the sides of HM 42. For example, flowable oxide 90 may extend up 75 to 95% of the vertical sides of HM 42.

Figure 13:
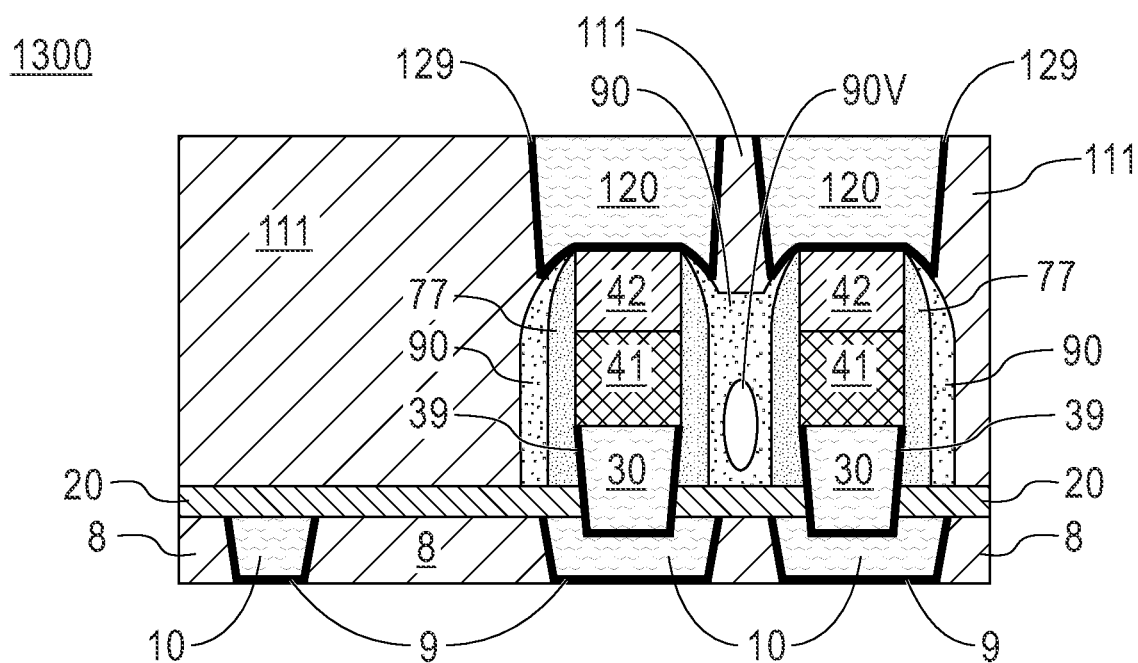
FIG. 13 depicts a cross-sectional view of the semiconductor structure with a void in the oxide in accordance with an embodiment of the present invention.

In one embodiment, a small void is present in oxide 90 (depicted in FIG. 13). The void in oxide 90 can occur during the deposition of oxide 90 when the deposition process such as PECVD pinches off the gap between the MRAM pillars in a top portion of oxide 90 between HM 42 or the upper portion of stack of material layers 41. The void may form below the pinched off portion of the gap between the MRAM pillars where oxide 90 pinches off or closes the gap before completely filling the area below the closed gap. For example, the portion of the gap adjacent and below HM 42 or below the top portion of stack of material layers 41 may not completely fill creating a small void in oxide 90. Similarly, when a flowable dielectric process is used to deposit oxide 90, the top portion of oxide 90 between HM 42 and stack of material layers 41 can be completely filled or blocked and any small voids would reside below hardmask 42 or top portion of stack of material layers 41.

Figure 10:
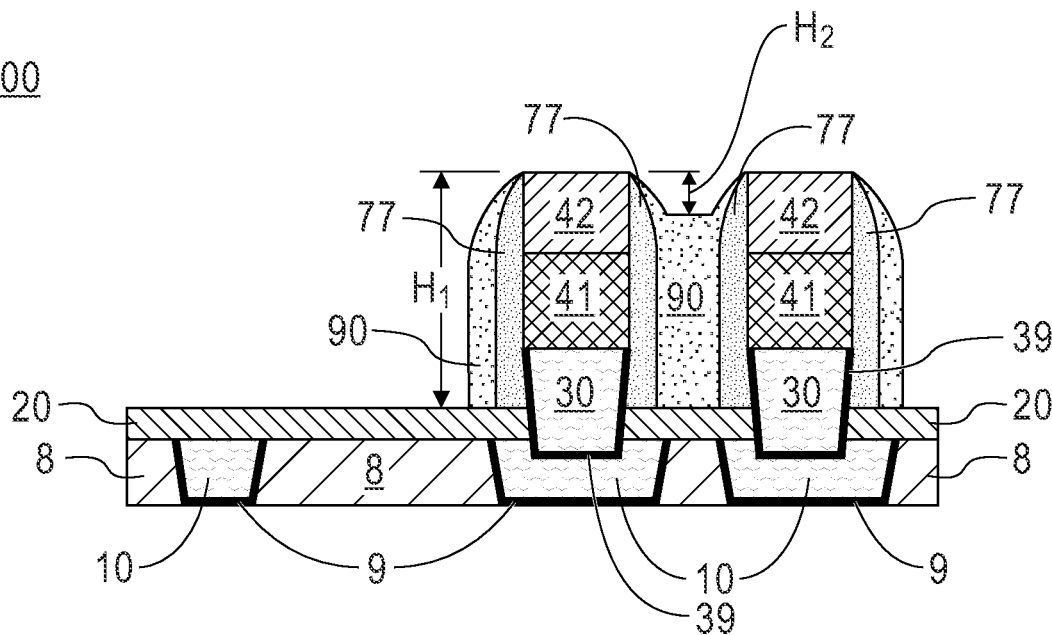
FIG. 10 depicts a cross-sectional view of the semiconductor structure after etching the oxide material in accordance with an embodiment of the present invention.

FIG. 10 depicts a cross-sectional view of semiconductor structure 1000 after etching oxide 90 in accordance with an embodiment of the present invention. As depicted, FIG. 10 includes ILD 8, metal liner 9, Mx 10, dielectric layer 20, metal liner 39, bottom electrodes 30, stack of material layers 41, HM 42, spacer 77, and a remaining portion of oxide 90 surrounding spacer 77. FIG. 10 also depicts, $H_1$, and $H_2$ discussed below. In some embodiments, oxide 90 covers each spacer 77 and fills the gap between the top portion of metal liner 39 around a top portion of bottom electrodes 30 and almost all of the gap between spacer 77 around HM 42. In these embodiments, oxide 90 fills the gap between the two MRAM pillars formed on bottom electrodes 30. When oxide 90 fills the gap between the two MRAM pillars after the etch process, then a top surface of oxide 90 is level with a top surface of HM 42. In various embodiments, a small dip or recess in the top surface of oxide 90 between spacer 77 occurs (e.g., the recess depicted between spacers 77 adjacent to the top portion of HM 42 on the MRAM pillars). In an embodiment, the recess in oxide 90 extends into a top portion of stack of material layers 41.

As depicted, $H_1$ is the distance between the top of dielectric layer 20 and the top of HM 42 and $H_2$ is the distance between the lowest portion of the surface of oxide 90 between HM 42 in the MRAM pillars and the top of HM 42. $H_1$ represents the distance or height of the gap needed to be filled between the MRAM pillars. $H_2$ represents the portion of the distance or height of the gap between the MRAM pillars that is not completely filled by oxide 90. $H_2$ represents the depth of the gap the low k dielectric will need to fill in later process steps discussed with respect to FIG. 11. Because low k dielectric materials for MRAM devices have less conformity and lower gap fill properties, reducing $H_2$ is desirable.

When oxide 90 is deposited by PECVD, PVD, or CVD, etc., then an etch or directional etch, such as an RIE, removes oxide 90 from exposed horizontal surfaces of dielectric layer 20 and HM 42. In this case, dielectric layer 20 and HM 42 can be an etch stop or an endpoint for the RIE process, and a small dip in the surface of oxide 90 between spacer 77 may occur. Due to the tight pitch between spacer 77 on HM 42 and stack of material layers 41 over bottom electrodes 30 (e.g., the tight pitch between the MRAM pillars), the portion of oxide 90 above dielectric layer 20 between the top portion of bottom electrodes 30 above dielectric layer 20 (e.g., the portion of oxide 90 between the MRAM pillars that are formed with stack of material layers 41 and HM 42) is not removed by the etch (e.g., RIE). In some cases, a small top portion of oxide 90 between spacer 77 on the top portion of HM 42 can be removed, as depicted in FIG. 10. As depicted, a slight dip in the surface of oxide 90 between spacers 77 on HM 42 in the MRAM pillars can occur. The slight dip results in a small value or a small distance for $H_2$. As depicted in FIG. 10, oxide 90 is over spacer 77 and after RIE etch, the remaining portion of oxide 90 on spacer 77 is adjacent to at least the bottom portion or the bottom half of HM 42.

In an embodiment, a CMP using HM 42 as an etch stop and patterning of the top surface of oxide 90 occurs prior to the anisotropic etch. For example, using photolithography to pattern the top surface of oxide 90 after CMP (e.g., to protect oxide 90 between the two MRAM pillars with a resist), a RIE can be used to remove oxide 90 from the exposed horizontal surfaces of dielectric layer 20 and HM 42. In this case, dielectric layer 20 and HM 42 can be etch stops or endpoints for the RIE process, and the patterned resist protects oxide 90 between spacer 77 on each of HM 42. In this example, after patterning, etching, and removing the remaining resist, the surface of oxide 90 is essentially flat (e.g., without a dip between MRAM pillars).

In other embodiments, when oxide 90 is deposited as a flowable dielectric material (e.g., by SOD), a CMP occurs followed by oxide 90 patterning and an oxide 90 etch process. In this example, HM 42 acts as a CMP stop. After the CMP planarizes the top surface of oxide 90, in these embodiments, a resist can be deposited for the photolithographic patterning process. The photolithographic patterning process exposes portions of oxide 90 that are not between the MRAM pillars or immediately adjacent to spacer 77 on the MRAM pillars. The photolithographic patterning can be followed by a wet or dry etch process to remove exposed portions of oxide 90. After the patterning and the etch process, oxide 90 remains on the sides of spacer 77 and above dielectric layer 20 between metal liner 39 on bottom electrodes 30, on the sides of stack of material layers 41, and the sides of HM 42 (e.g., remains between the MRAM pillars and on a portion of dielectric layer 20 adjacent to spacer 77). In this way, using photographic patterning and etch of oxide 90 when oxide 90 is deposited as flowable oxide material (e.g., using SOD or FCVD) leaves a flat surface or a relatively flat surface on oxide 90 between HM 42 and spacer 77 in the MRAM pillars. Little to no other gap fill is needed to fill the gap between the MRAM pillars as oxide 90 deposited, using SOD or FCVD, has good conformality and essentially fills the gap between the tightly pitched MRAM pillars without forming voids. In this example, $H_2$ is small. For example, $H_2$ is in the range of several nm to 15 nm.

Figure 11:
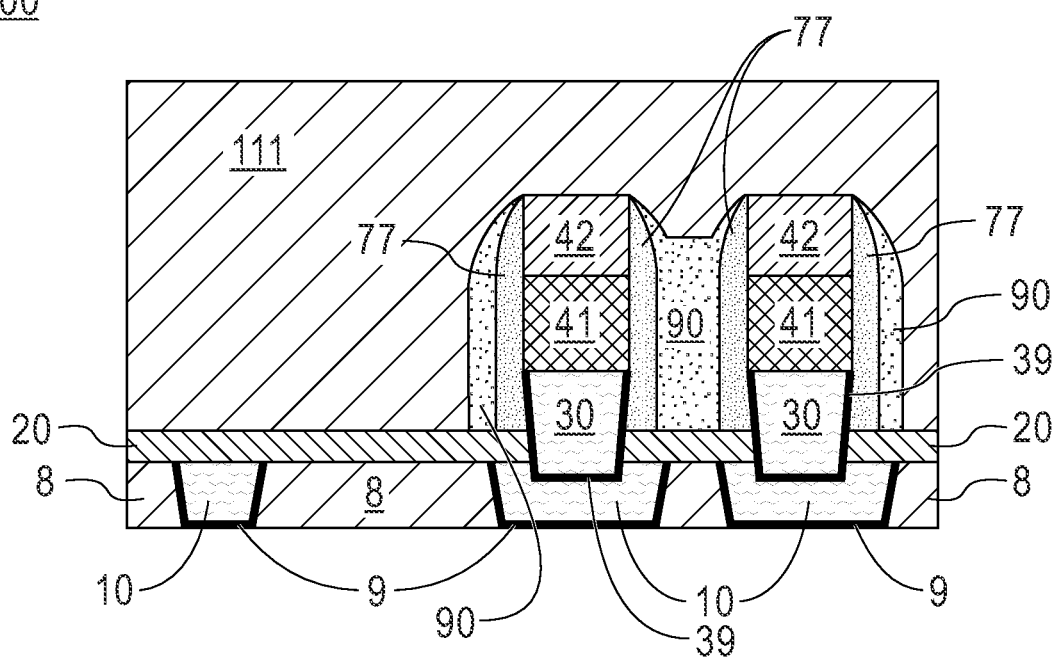
FIG. 11 depicts a cross-sectional view of the semiconductor structure after depositing a low-k dielectric material in accordance with an embodiment of the present invention.

FIG. 11 depicts a cross-sectional view of semiconductor structure 1100 after depositing low-k dielectric material 111 in accordance with an embodiment of the present invention. As depicted, FIG. 11 includes the elements of FIG. 10 and low k dielectric material 111 deposited over exposed surfaces of dielectric layer 20, oxide 90, and hardmask 42. The layer of low k dielectric material 111 extends above the top surface of hardmask 42. As depicted, low k dielectric material 111 is void-free. In various embodiments, low k dielectric material 111 fills the small recess or divot in oxide 90 between the MRAM pillars. The small divot in oxide 90 can be adjacent to the top portion of the MRAM pillars (e.g., adjacent to HM 42). After depositing low k dielectric material 111 using a known deposition process, such as CVD or PVD, a CMP may planarize the top surface of low k dielectric material 111 without exposing hardmask 42.

Figure 12:
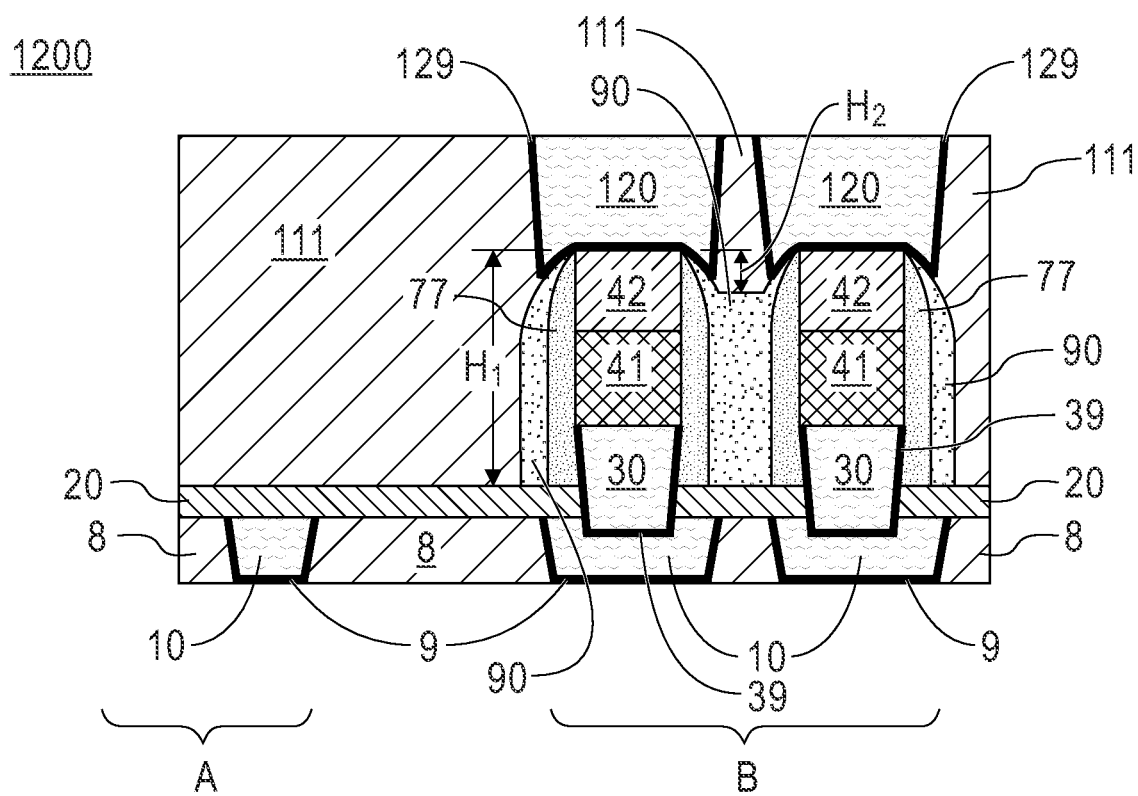
FIG. 12 depicts a top view of the semiconductor structure after forming top electrodes in accordance with an embodiment of the present invention.

FIG. 12 depicts a cross-sectional view of semiconductor structure 1200 after forming top electrodes 120 in accordance with an embodiment of the present invention. As depicted, FIG. 12 includes ILD 8, metal liner 9, Mx 10, dielectric layer 20, metal liner 39, bottom electrodes 30, stack of material layers 41, HM 42, spacer 77, oxide 90, low k dielectric material 111, top electrodes 120, logic region A, memory region B, $H_1$ that depicts the distance from the top of dielectric layer 20 to the top of HM 42, and $H_2$ that depicts is the distance from the top surface of the lowest point of the surface oxide 90 between HM 42 and the top of HM 42. As previously discussed, reducing $H_2$ improves low k dielectric material 111 gap fill by reducing the portion of the gap between the MRAM pillars filled by low k dielectric material 111. In this way, low k dielectric material 111 with less conformality and gap fill capability than oxide 90 does not create voids or seams between top electrodes 120 or in the vicinity of top electrodes 120 during tightly pitched MRAM device formation.

In traditional MRAM device formation processes without oxide 90, the aspect ratio of $H_1$ to $H_2$ is about 1. In tightly pitched MRAM devices formed without oxide 90, the gap, or the distance, $H_2$ that the low k dielectric material 111 must fill typically extends from the top of a dielectric material, like dielectric layer 20 to the top of HM 42 under top electrodes 120. In this case, $H_2$ is approximately the same as $H_1$. In embodiments of the present invention, the deposition and patterning of oxide 90 provides $H_2$ in semiconductor structure 1200 than is much less than $H_2$ in a traditionally formed MRAM device.

As depicted in FIG. 12, the area or the portion of the gap filled by low k dielectric material 111 is smaller than the area or the portion of the gap filled by oxide 90. Using the processes discussed with respect to FIGS. 1-12, reduces the aspect ratio of $H_1$ to $H_2$ and reduces the depth of the gap or recess that low k dielectric material 111 fills. Using oxide 90 with better conformality and gap fill reduces $H_2$ as oxide 90 fills most if not all of the gap between the MRAM pillars formed on bottom electrodes 30.

In various embodiments, top electrodes 120 are formed over HM 42. Using known electrode formation processes, an etch of low k dielectric material 111 exposes a portion of HM 42 on each MRAM pillar. Using previously discussed processes and metal liner materials, metal liner 129 may be deposited on exposed surfaces of low k dielectric material 111, HM 42, and any small portion of oxide 90 exposed after the etch process. A layer of an electrode metal, such as but not limited to Cu, TiN, or W can be deposited on metal liner 129. A CMP can occur removing the top portion of metal liner 129, the top portion of the electrode material layer over low k dielectric material 111 to form top electrodes 120. In some embodiments, top electrodes 120 are bitlines.

As depicted, each of the two MRAM devices depicted in FIG. 12 include an MRAM pillar that is composed of stack of material layers 41 covered by HM 42 on bottom electrode 30. Each MRAM pillar has vertical sides covered by spacer 77 and one of top electrodes 120 resides on the MRAM pillar. Each the two MRAM devices depicted in FIG. 12 include an MRAM pillar, bottom electrode 30 and a top electrode 120.

While two MRAM devices are depicted in FIG. 12, any number of MRAM devices can be reside in memory region B. FIG. 12 also includes Mx 10 in logic region A. In some examples (not depicted), metal lines, contacts, vias, or other semiconductor devices maybe formed above Mx 10 in logic region A. The processes discussed with respect to FIGS. 9-11 to form semiconductor structure 1100 can prevent the formation of a void or a seam in either oxide 90 or in the low k material in the area of semiconductor structure 1100 adjacent top electrodes 120. In an embodiment, a void in oxide 90 may occur below the area adjacent to top electrodes 120.

FIG. 13 depicts a cross-sectional view of semiconductor structure 1300 when void 90V forms during deposition of oxide 90 in accordance with an embodiment of the present invention. FIG. 13 is essentially the same as FIG. 12 except for the presence of void 90V between a top portion of bottom electrodes 30 and a bottom portion of stack of material layers 41 in the adjacent, tightly pitched MRAM pillars. Void 90V can be formed in the lower portion of the gap between the two MRAM pillars. As depicted in FIG. 13, void 90V is formed in oxide 90 adjacent to spacer 77 and below HM 42. For example, void 90V forms adjacent to or below the bottom portion or half of stack of material layers 41.

Void 90V initially forms during the oxide deposition process, discussed with respect to FIG. 9. As depicted, void 90V does not form in the vicinity of top electrodes 120 (e.g., void 90V is below the bottom surfaces of top electrodes 120). In this way, void 90V does not impact the MRAM device functionality or the completed semiconductor device reliability (e.g., void 90V will not generate shorts between top electrodes 120 or bitlines initially or over time due to metal contact or trapped fluids). In FIG. 13, void 90V forms in oxide 90 adjacent to bottom electrodes 30 and a bottom half or bottom portion of stack of material layers 41 however, in other examples, void 90V may be smaller and resides in a different location below the top portion of stack of material layers 41 (e.g., not near top electrodes 120). In an embodiment, void 90V resides below the bottom of HM 42.

Figure 14:
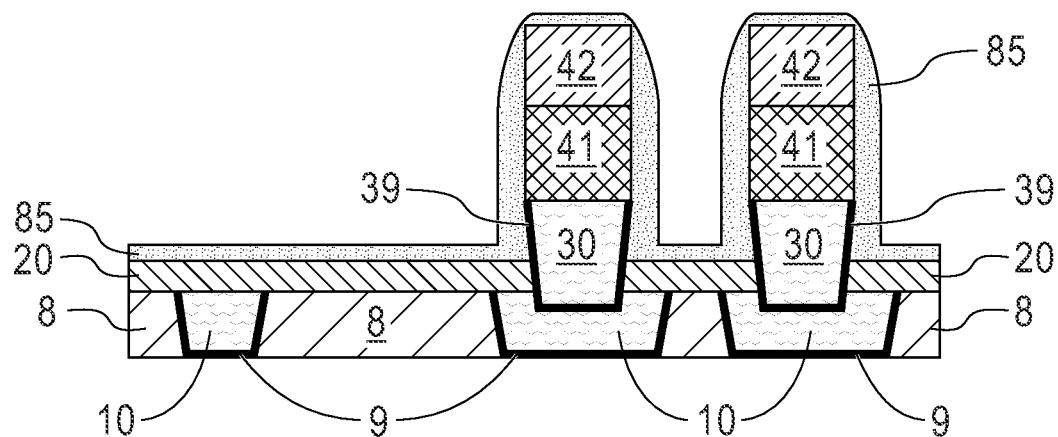
FIG. 14 depicts a cross-sectional view of the semiconductor structure after etching a layer of a spacer material to form a spacer in accordance with another embodiment of the present invention.

FIG. 14 depicts a cross-sectional view of semiconductor structure 1400 after performing a partial spacer etch in accordance with another embodiment of the present invention. As depicted, FIG. 14 includes ILD 8, Mx 10, metal liner 9, dielectric layer 20, metal liner 39, bottom electrodes 30, stack of material layers 41, HM 42, and spacer material 85. In some embodiments, a partial etch of spacer material 85 occurs as depicted in FIG. 14. FIG. 14 uses semiconductor structure 700 in FIG. 7 with spacer material 85 instead of spacer material 77 to perform a partial spacer etch of spacer material 85. Spacer material 85 can be the same material as spacer material 77 in FIG. 7 but, the spacer material 85 is not limited to spacer material 77 and can be any dielectric material used for spacer formation in semiconductor devices.

As depicted in FIG. 14, a partial spacer etch of spacer material 85 can occur. For example, a directional or RIE may remove the top portion of space material 85 forming a spacer around the MRAM pillars and leaving a thin layer of spacer material 85 over dielectric layer 20 and HM 42. After the partial spacer etch, spacer material 85 remains on the bottom portion of metal liner 39 and on stack of material layers 41 to form the spacer and also remains as a thin layer of spacer material 85 above HM 42 and the exposed surfaces of dielectric layer 20. As depicted, spacer material 85 on HM 42 thins near the top surface of HM 42 like a typical spacer, but also continues over with a thin layer over the top surface of HM 42. After the partial spacer etch, spacer material 85 remains on the vertical surfaces or sides of metal liner 39, stack of material layers 41, and HM 42 forming a conventional spacer. A thin layer of spacer material 85 also remains on the horizontal surfaces of semiconductor structure 1400. The RIE etch is controlled by process time to intentionally leave a portion of spacer material 85 (e.g., SiN) behind. The intention here to ensure metal 10 is not exposed and does not diffuse out during or after the RIE process.

Figure 15:
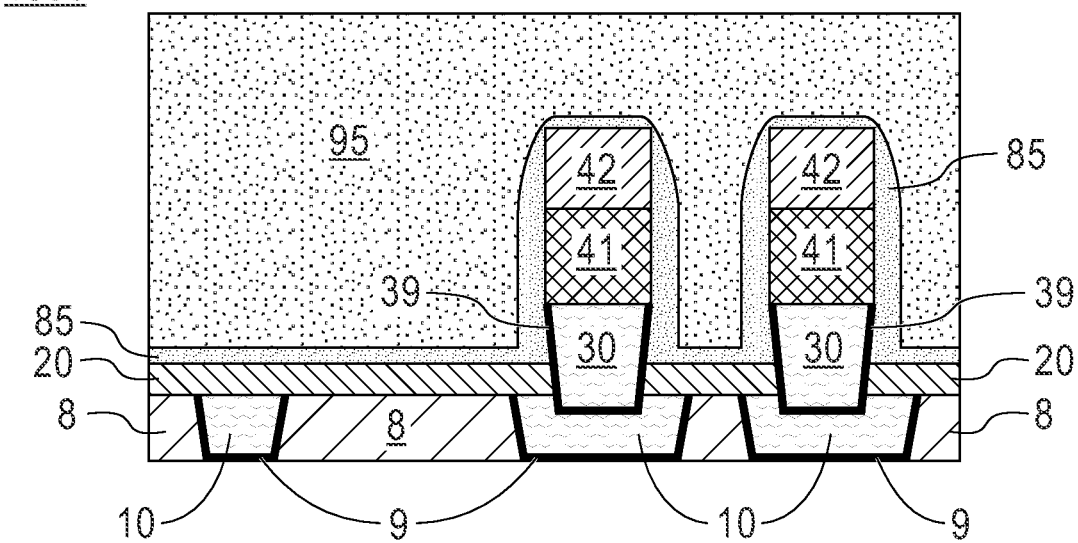
FIG. 15 depicts a cross-sectional view of the semiconductor structure after depositing an oxide material in accordance with an embodiment of the present invention.

FIG. 15 depicts a cross-sectional view of semiconductor structure 1500 after depositing oxide 95 in accordance with an embodiment of the present invention. As depicted, FIG. 15 includes the elements of FIG. 14 and a layer of oxide 95. Oxide 95 is essentially the same as oxide 90 except that oxide 90 covers spacer material 85. As previously discussed, oxide 95 can be an oxide material, such as $SiO_2$, a SOD, or an insulator material, such as a spin-on-glass, or TEOS. Oxide 95 can be deposited with the processes and materials previously discussed in detail with reference to FIG. 10. For example, oxide 95 can be deposited using PECVD, PVD, CVD, SOD, ALD, or FCVD. As depicted, oxide 95 is over spacer material 85. Oxide 95 fills the gaps between the MRAM pillars and extends a distance above the top surface of oxide 95 on the MRAM pillars.

Figure 16:
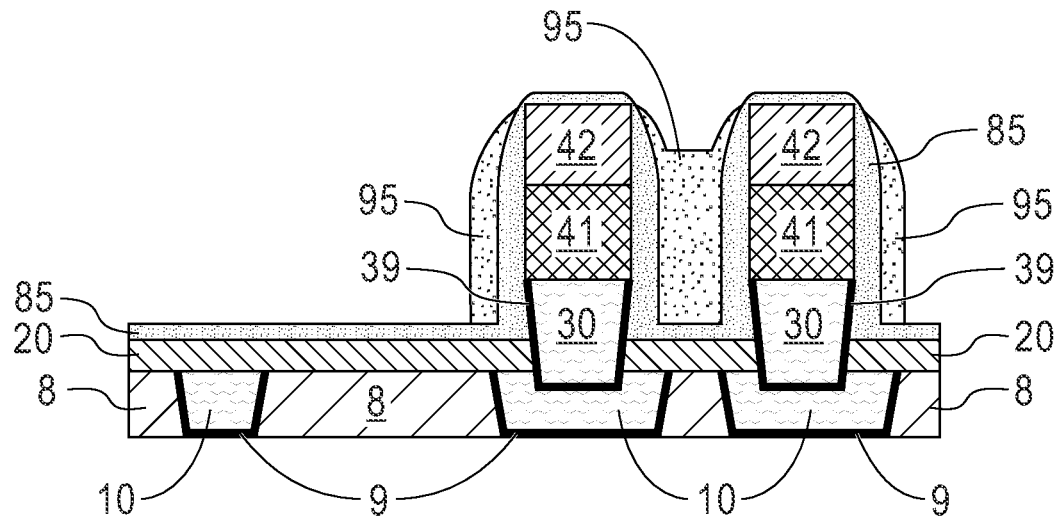
FIG. 16 depicts a cross-sectional view of the semiconductor structure after etching a portion of the oxide material in accordance with an embodiment of the present invention.

FIG. 16 depicts a cross-sectional view of semiconductor structure 1600 after etching a portion of oxide 95 in accordance with an embodiment of the present invention. In various embodiments, a directional, self-aligned process etches the portions of oxide 95 that are over the horizontal surfaces of spacer material 85 and that are not between the MRAM pillars. As previously discussed in detail with respect to FIG. 10, the directional etch or RIE leaves most of oxide 95 between the tightly pitched MRAM pillars (i.e., above spacer material 85) and on the vertical sides of the MRAM pillars covered with spacer material 85. More specifically, as depicted in FIG. 16, oxide 95 remains above spacer material 85 between bottom electrodes 30, and on the vertical portions spacer material 85 that are on the vertical sides of the HM 42, stack of material layers 41, and the top portion of metal liner 39. The height oxide 95 extends above spacer material 85 between the MRAM pillars may vary. For example, the height of oxide 95 above spacer material 85 between the MRAM pillars can be just almost level with the top surface of spacer material 85 on HM 42 (e.g., just below the top surface of HM 42) to level with the top portion of stack of material layers 41. After the directional etch (e.g., RIE), the top surface of oxide 95 between the two MRAM pillars is continuous and, in some cases, may have a slight recess. No voids, cracks, or seams extend from the top surface of oxide 95 into the top portion of oxide 95.

Figure 17:
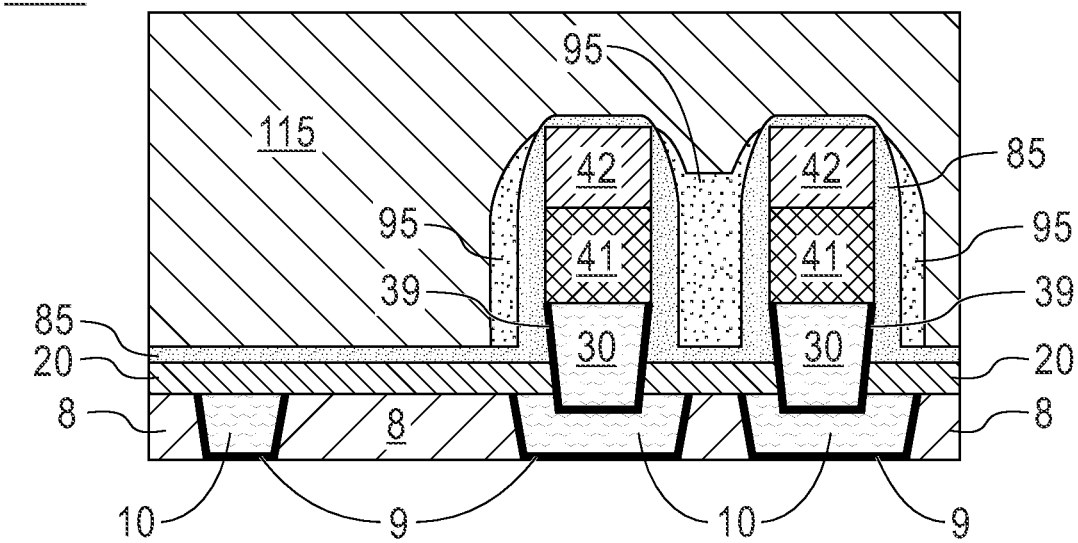
FIG. 17 depicts a cross-sectional view of the semiconductor structure after depositing a low k dielectric material in accordance with an embodiment of the present invention.

FIG. 17 depicts a cross-sectional view of semiconductor structure 1700 after depositing low k dielectric material 115 in accordance with an embodiment of the present invention. As depicted, FIG. 17 includes the elements of FIG. 16 and low k dielectric material 115. Low k dielectric material 115 is essentially the same as low k dielectric material 111. A layer of low k dielectric material 115 is deposited over spacer material 85 and around and over oxide 95. As depicted, no voids are present in low k dielectric material 115 in FIG. 17.

Figure 18:
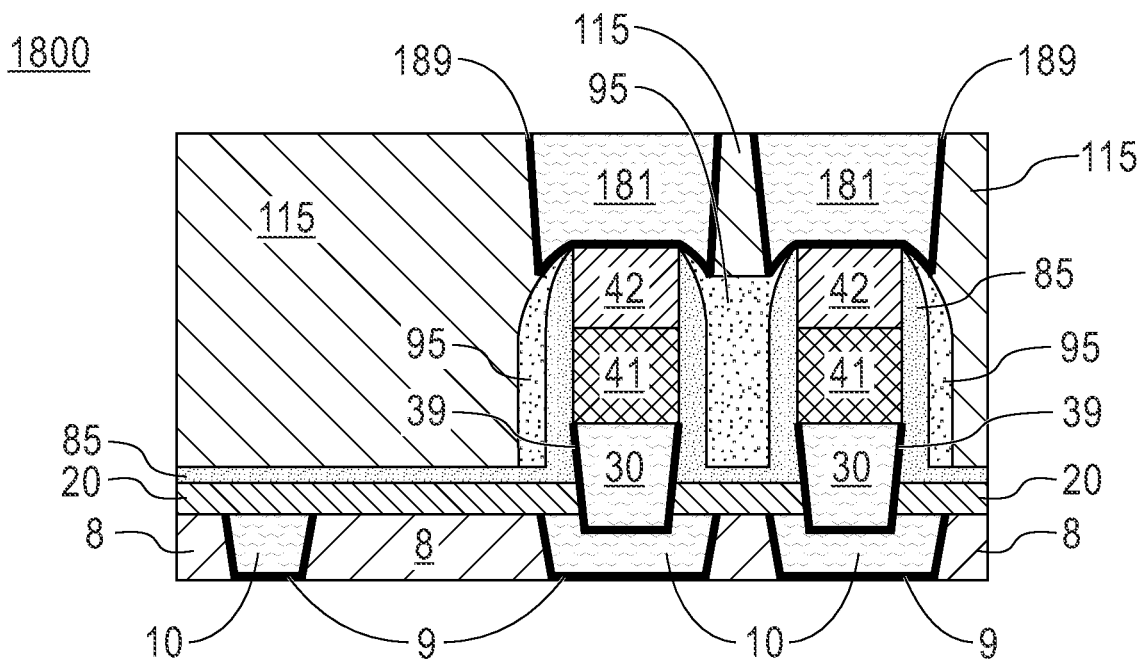
FIG. 18 depicts a cross-sectional view of the semiconductor structure after forming top electrodes in accordance with an embodiment of the present invention.

FIG. 18 depicts a cross-sectional view of semiconductor structure 1800 after forming top electrodes 181 in accordance with an embodiment of the present invention. For example, top electrodes 181 with metal liner 189 can be formed with known electrode formation and metal etch processes as previously discussed in detail with respect to FIG. 12. As depicted, FIG. 18 includes ILD 8, Mx 10, dielectric layer 20, metal liner 29, bottom electrodes 30, stack of material layers 41, HM 42, spacer material 85, oxide 95, low k dielectric material 115, metal liner 189, and top electrodes 181. Top electrodes 181 with metal liner 189 are formed in low k dielectric material 115 on HM 42. In some examples, top electrodes 181 may be over a small portion of oxide 95 near the top of HM 42. As previously discussed with respect to FIG. 12, in other examples, lines, contacts, vias, and other semiconductor devices may be formed in the logic region (not depicted). As depicted, no voids are present in the vicinity of top electrodes 181 or metal liner 189.

Figure 19:
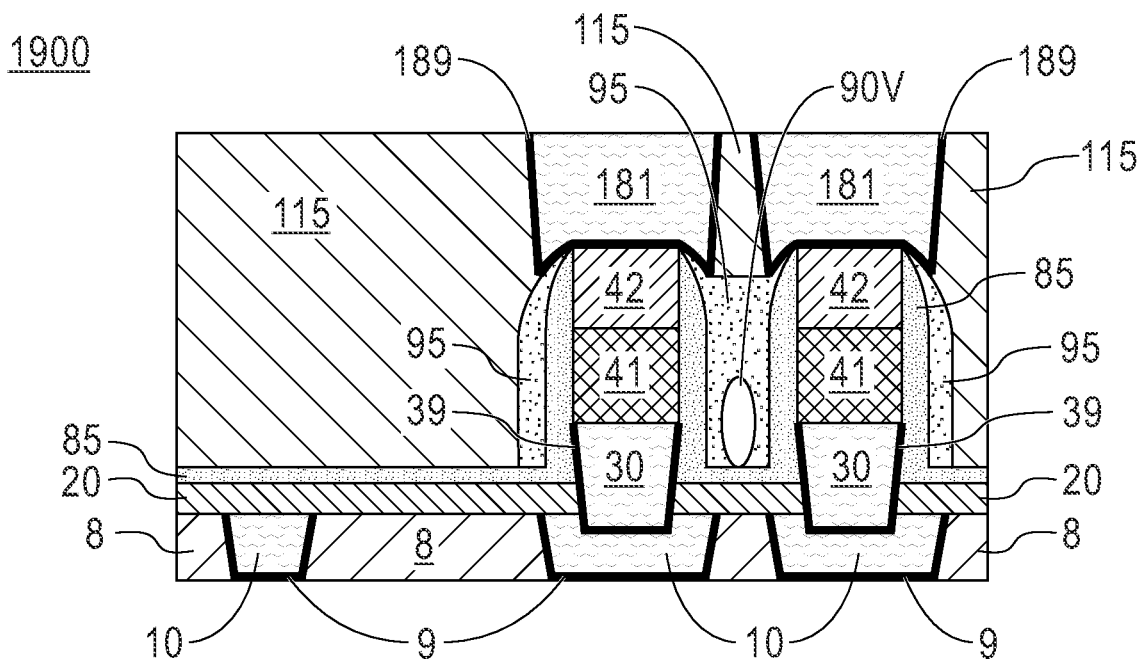
FIG. 19 depicts a cross-sectional view of the semiconductor structure with void in the oxide material in accordance with an embodiment of the present invention.

FIG. 19 depicts a cross-sectional view of semiconductor structure 1900 with void 90V in oxide 95 in accordance with an embodiment of the present invention. As depicted, FIG. 19 includes the elements of FIG. 18 and void 90V. Void 90V in FIG. 19 is essentially the same as void 90V in FIG. 13. As depicted, FIG. 19 is formed with materials and processes as discussed in FIGS. 14-18 with the exception of 90V, which is a small void that forms during oxide 95 deposition in FIG. 15. As discussed in detail with regard to FIGS. 9 and 13, void 90V is formed below top electrodes 181. If a void 90V forms during oxide 95 deposition, the top surface of oxide 95 between HM 42 and a top portion of stack of material layers 41 remains continuous (e.g., void 90V does not extend into the top surface of oxide 95 and is not in the vicinity of top electrodes 181). As depicted, 90V is formed in the portion of oxide 95 below HM 42 in the portion of oxide 95 adjacent to metal liner 29 and the lower half of stack of material layers 41. In other examples, void 90V can be smaller and/or may reside in a different position below HM 42.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor structure, the semiconductor structure comprising:
    two adjacent bottom electrodes in a layer of a first dielectric material and above a metal layer;
    two adjacent pillars are each on one of the two adjacent bottom electrodes, wherein each pillar of the two adjacent pillars is composed of a stack of materials for a memory device;
    a spacer on the first dielectric layer, on a top portion of the two adjacent bottom electrodes, and around vertical sides of the two adjacent pillars;
    a second dielectric material around vertical sides of the spacer and on the layer of the first dielectric material between the two adjacent bottom electrodes, wherein the second dielectric material fills at least a first portion of a gap between the two adjacent pillars; and
    a low k material covering the second dielectric material and exposed portions of the layer of the first dielectric material.

2. The semiconductor structure of claim 1, further comprises a top electrode on top of each of the two adjacent pillars in the low k dielectric material.

3. The semiconductor structure of claim 1, wherein each of the two adjacent pillars are composed of a stack of materials for a magnetoresistive random-access memory device.

4. The semiconductor structure of claim 1, wherein the low k dielectric material covering the second dielectric material fills a second portion of the gap between the two adjacent pillars.

5. The semiconductor structure of claim 2, wherein the low k material covering the second dielectric material is void-free between the top electrode on a top of each of the two adjacent pillars.

6. The semiconductor structure of claim 1, wherein the second dielectric material is void-free.

7. The semiconductor structure of claim 4, wherein the second portion of the gap between the two adjacent pillars is much smaller than the at least the first portion of the gap between the two adjacent pillars.

8. The semiconductor structure of claim 1, wherein the at least the first portion of the gap between the two adjacent pillars extends from a top of the layer of the first dielectric material to a portion of a hardmask in the two adjacent pillars.

9. The semiconductor structure of claim 4, wherein the second portion of the gap between the two adjacent pillars extends from a lowest point in a top surface of the second dielectric material between the two adjacent pillars to a top of a hardmask in the two adjacent pillars.

10. The semiconductor structure of claim 1, wherein the two adjacent pillars composed of the stack of materials for the memory device are two vertical structures for forming a magnetoresistive random-access memory device.

11. The semiconductor structure of claim 1, wherein the second dielectric material provides improved gap fill capability compared to the gap fill capability of the low k dielectric material.

12. The semiconductor structure of claim 1, wherein the second dielectric material filling the at least the first portion of the gap between the two adjacent pillars further comprises the second dielectric material filling a gap between each spacer of the spacer around the vertical sides each of the two adjacent pillars.

13. The semiconductor structure of claim 1, wherein the two adjacent bottom electrodes in the layer of the first dielectric material above the metal layer are in a matrix of a plurality of bottom electrodes.

14. The semiconductor structure of claim 1, wherein the second dielectric material is one of an oxide material, a nitride material, or a spin-on-glass.

15. A semiconductor structure comprising:
    two adjacent bottom electrodes in a layer of a first dielectric material and above a metal layer;
    two adjacent pillars are each on one of the two adjacent bottom electrodes, wherein each pillar of the two adjacent pillars is composed of a stack of materials for a memory device;
    a layer of a spacer material around vertical sides each of the two adjacent pillars and a thinner portion of the layer of the spacer material on surfaces of the first dielectric material;
    a second dielectric material on the spacer, on the thinner portion of the spacer material on surfaces of the first dielectric material between the two adjacent pillars, wherein the second dielectric material fills at least a first portion of a gap between the two adjacent pillars; and
    a low k material covering the second dielectric material and exposed portions of the thinner portion of the layer of the spacer material on exposed surfaces of the first dielectric material.

16. The semiconductor structure of claim 15, wherein the second dielectric material provides improved gap fill capability compared to the gap fill capability of the low k dielectric material.

17. The semiconductor structure of claim 15, wherein the low k dielectric material covering the second dielectric material fills a second portion of the gap between the two adjacent pillars.

18. The semiconductor structure of claim 15, wherein the low k material covering the second dielectric material is void-free between a top electrode on a top of each of the two adjacent pillars.

19. The semiconductor structure of claim 17, wherein the second portion of the gap between the two adjacent pillars is much smaller than the at least the first portion of the gap between the two adjacent pillars.

20. The semiconductor structure of claim 15, wherein the at least the first portion of the gap between the two adjacent pillars extends from a top of the layer of the first dielectric material to a portion of a hardmask in the two adjacent pillars.

21. The semiconductor structure of claim 17, wherein the second portion of the gap between the two adjacent pillars extends from a lowest point in a top surface of the second dielectric material between the two adjacent pillars to a top of a hardmask in the two adjacent pillars.

22. The semiconductor structure of claim 15, further comprises a top electrode on top of each of the two adjacent pillars in the low k dielectric material.

23. The semiconductor structure of claim 15, wherein each of the two adjacent pillars are composed of a stack of materials for a magnetoresistive random-access memory device.

* * * * *